US008994096B2

(12) United States Patent
Golubovic

(10) Patent No.: US 8,994,096 B2
(45) Date of Patent: Mar. 31, 2015

(54) MULTI-TRANSISTOR MEMORY CELL WITH AN ENHANCEMENT JUNCTION FIELD EFFECT TRANSISTOR (JFET) AS THE ACCESS GATE TRANSISTOR

(75) Inventor: Dusan Golubovic, Leuven (BE)

(73) Assignee: NXP B.V., Eindhoven (NL)

( * ) Notice: Subject to any disclaimer, the term of this patent is extended or adjusted under 35 U.S.C. 154(b) by 949 days.

(21) Appl. No.: 13/124,925

(22) PCT Filed: Oct. 22, 2009

(86) PCT No.: PCT/IB2009/054675
§ 371 (c)(1),
(2), (4) Date: Apr. 19, 2011

(87) PCT Pub. No.: WO2010/046873
PCT Pub. Date: Apr. 29, 2010

(65) Prior Publication Data
US 2011/0215395 A1    Sep. 8, 2011

(30) Foreign Application Priority Data
Oct. 23, 2008  (EP) .................................. 08167453

(51) Int. Cl.
*H01L 29/792*  (2006.01)
*H01L 27/115*  (2006.01)
*H01L 21/28*   (2006.01)
*H01L 29/423*  (2006.01)
(Continued)

(52) U.S. Cl.
CPC ..... *H01L 27/11568* (2013.01); *H01L 21/28282* (2013.01); *H01L 29/4234* (2013.01); *H01L 29/495* (2013.01); *H01L 29/66833* (2013.01); *H01L 29/792* (2013.01)

USPC .......................................................... 257/326

(58) Field of Classification Search
CPC . H01L 29/495; H01L 29/792; H01L 29/4234; H01L 21/28282
USPC .......................................................... 257/326
See application file for complete search history.

(56) References Cited

U.S. PATENT DOCUMENTS 6,184,554 B1    2/2001 Chen
6,475,857 B1 *  11/2002 Kim et al. ..................... 438/240
7,450,418 B2 *  11/2008 Liao et al. ................ 365/185.05
(Continued)

FOREIGN PATENT DOCUMENTS

EP      1 339 107 A1    8/2003
WO    2007/043010 A1    4/2007
(Continued)

OTHER PUBLICATIONS

International Search Report and Written Opinion for Application PCT/IB2009/054675.

*Primary Examiner* — Nathan Ha

(57) ABSTRACT

The invention relates to a multi-transistor, e.g. a two-transistor memory cell with an enhancement junction field effect transistor (JFET) as the access gate transistor. In one embodiment, the JFET is provided as a self-aligned JFET. Accordingly, and advantageous over the prior art, the invention allows for a method for manufacturing a multi-transistor, e.g. a two-transistor memory cell comprising a JFET as the access transistor without adding any additional masks and/or processing steps. Such a multi-transistor, e.g. a two-transistor memory cell according to invention, provides an improved reliability.

10 Claims, 4 Drawing Sheets

(51) Int. Cl.
*H01L 29/49* (2006.01)
*H01L 29/66* (2006.01)

(56) References Cited

U.S. PATENT DOCUMENTS

| | | | |
|---|---|---|---|
| 7,595,237 B2 * | 9/2009 | Chen et al. | 438/258 |
| 7,746,715 B2 | 6/2010 | Van Duuren | |
| 7,920,424 B2 * | 4/2011 | Georgescu et al. | 365/185.14 |
| 2002/0025644 A1 * | 2/2002 | Cho et al. | 438/305 |
| 2002/0053710 A1 * | 5/2002 | Io | 257/408 |
| 2003/0032243 A1 | 2/2003 | Ogura et al. | |
| 2004/0238878 A1 | 12/2004 | Sato et al. | |
| 2005/0117443 A1 * | 6/2005 | Park et al. | 365/232 |
| 2005/0224864 A1 * | 10/2005 | Hashimoto et al. | 257/315 |
| 2005/0282332 A1 * | 12/2005 | Hsu et al. | 438/232 |
| 2006/0118858 A1 | 6/2006 | Jeon et al. | |
| 2006/0157774 A1 | 7/2006 | Chang | |
| 2006/0157775 A1 * | 7/2006 | Kim et al. | 257/315 |
| 2007/0120173 A1 * | 5/2007 | Lojek | 257/315 |
| 2007/0242523 A1 * | 10/2007 | Liao et al. | 365/185.28 |
| 2007/0252194 A1 | 11/2007 | Shin et al. | |
| 2008/0006873 A1 | 1/2008 | Om | |
| 2010/0074029 A1 | 3/2010 | Katayama | |

FOREIGN PATENT DOCUMENTS

| | | |
|---|---|---|
| WO | 2008/038236 A2 | 4/2008 |
| WO | 2008/041536 A1 | 4/2008 |

* cited by examiner

MULTI-TRANSISTOR MEMORY CELL WITH AN ENHANCEMENT JUNCTION FIELD EFFECT TRANSISTOR (JFET) AS THE ACCESS GATE TRANSISTOR

FIELD OF THE INVENTION

The invention relates to a multi-transistor, e.g. two transistor memory cell and to a method for manufacturing a multi-transistor, e.g. two-transistor memory cell as well as to arrays of such cells in memory devices.

BACKGROUND OF THE INVENTION

Two-transistor memory cells relate to non-volatile memory cells which comprise at least one access transistor and at least one memory transistor. Non-volatile memory cells are used in a wide variety of commercial and military electronic devices and equipment, such as RFID/NFC, smart cards, automotive applications, mobile phones, radios or digital cameras. The market for these electronic devices continually demands devices with a lower voltage, lower power consumption and decreased chip size.

The access transistor typically comprises diffusion implants, which can act as source or drain, an access channel region and an access gate. The access channel region is often arranged intermediate the diffusion regions of the access transistor. The memory transistor typically comprises diffusion implants, which can act as a source or a drain, a memory channel region, a memory gate stack and a memory gate. The memory channel region is often arranged intermediate the diffusion implants. The memory gate stack is typically located above the memory channel region and is arranged for storing electronic charge. Typically, the memory gate stack comprises a stack of layers comprising a first insulating layer, a charge storage layer and a second insulating layer, wherein the first insulating layer is arranged intermediate the memory channel region and the charge storage layer, and the second insulating layer is arranged intermediate the charge storage layer and the memory gate. Under control of a gate voltage of the memory transistor, i.e. the memory gate voltage, the memory gate stack can be programmed and erased.

In SONOS (Semiconductor Oxide-Nitride-Oxide Semiconductor) memory cell devices, the memory gate stack comprises at least a stack of a bottom silicon dioxide layer, a charge trapping silicon nitride layer and a top silicon dioxide layer, also known as an ONO stack. SONOS memory cell devices are used in view of scaling, as reduced program and erase voltages can be obtained. However, as such low power SONOS memory cells, operated by direct tunnelling, suffer from retention problems, high-K dielectrics in combination with metal gates are used to replace the silicon oxide layers. Such non-volatile memory cells, wherein the silicon oxide layers are replaced by $HfSiO_x$ are usually referred to as SHINOS memory transistors. However, while such SHINOS memory transistors have the desired properties in terms of program and erase characteristics, endurance and retention, such memory transistors with a high-K gate dielectric provided as $HfSiO_x$ suffer from inherent reliability problems.

Accordingly, it is the object of the invention to provide a multi-transistor, e.g. two-transistor memory cell and a method for manufacturing a multi-transistor, e.g. two-transistor memory cell that provides a good reliability as well as to arrays of such cells in memory devices.

An advantage of the present invention can be the provision of reduced program and erase voltages for a multi-transistor, e.g. two-transistor memory cell.

SUMMARY

This object is addressed by a multi-transistor, e.g. two-transistor memory cell arranged on a semiconductor substrate comprising an access transistor and a memory transistor, the access transistor comprising an enhancement junction field effect transistor having an access channel region, a first implant and a second implant, a first diffusion implant and a second diffusion implant, and an access gate, wherein the access channel region is arranged intermediate the first implant and the second implant, the first implant and the second implant is arranged intermediate the first diffusion implant and the second diffusion implant, the access gate is arranged above the access channel region, the memory transistor comprises a memory channel region, a third implant and a fourth implant, a third diffusion implant and a fourth diffusion implant, a memory gate stack, and a memory gate, the memory channel region is arranged intermediate the third implant and the fourth implant, the third implant and the fourth implant is arranged intermediate the third diffusion implant and the fourth diffusion implant, the memory gate stack is arranged above the memory channel region, and the memory gate is arranged above the memory gate stack.

DETAILED DESCRIPTION

Accordingly, it is an essential idea of the invention to provide a multi-transistor, e.g. two-transistor memory cell that is characterized by a high reliability while preferably realized with a metal gate-SHINOS memory transistor while avoiding the use of an access transistor with a high-K dielectric. It is a further advantage that the multi-transistor, e.g. two-transistor memory cell according to the invention does not put any constrains on the memory cell size compared to an NMOS transistor as the access gate known from the prior art. The second diffusion implant can be in common with the third diffusion region. The width of the memory gate stack exceeds the width of the memory channel region and/or the width of the access gate can exceed the width of the access channel region.

According to another embodiment of the invention, the memory gate stack comprises a bottom dielectric layer, a charge trapping layer such as a nitride charge trapping layer, a top dielectric layer, a metal layer and a poly silicon layer, wherein the charge trapping layer, e.g. the nitride charge trapping layer is arranged above the bottom dielectric layer, the top dielectric layer is arranged above the charge trapping layer, e.g. the nitride charge trapping layer, the metal layer is arranged above the top dielectric layer, and the poly silicon layer, is arranged above the metal layer. Preferably, the charge trapping layer is provided as $Si_3N_4$ and the poly silicon layer preferably comprises a thickness of 10-20 nm.

According to another embodiment of the invention, the access transistor is an enhancement junction field effect transistor (JFET). It is further preferred that the junction field effect transistor is provided as a self-aligned JFET.

According to another embodiment of the invention, the access channel region and/or the memory channel region are/is a shallow n-type conductivity implant. In other words, the access channel region and/or the memory channel region are/is preferably provided as a depletion layer, i.e. by phosphorus injection.

According to another embodiment of the invention, the access gate and/or the memory gate are/is a $p^+$-type conductivity epitaxial silicon layer or a $p^+$-type conductivity poly silicon layer. In other words, the access gate of the JFET can be provided as a $p^+$-doped epitaxial silicon layer or as a $p^+$-doped poly silicon layer, however, the latter embodiment assumes that the leakage of the JFET access transistor with the $p^+$-doped poly silicon gate can be tolerated.

According to another embodiment of the invention, the semiconductor substrate comprises a flash p-well type conductivity silicon layer and an n-well type conductivity silicon layer, wherein the flash p-well type conductivity silicon layer is arranged above the n-well type conductivity silicon layer.

According to another embodiment of the invention, the first implant and/or the second implant and/or the third implant and/or the fourth implant are/is a lowly or a moderately doped drain implant and/or the first diffusion implant and/or the second diffusion implant and/or the third diffusion implant and/or the fourth diffusion implant are/is a highly doped drain or source implant. In other words, such a lowly or moderately doped drain implant allows for creating a reduced doping gradient between a drain/source to be formed and the access channel region and/or the memory channel region, which lowers a maximum electric field in the access channel region and/or the memory channel region in the vicinity of the drain/source. Preferably, the lowly or moderately doped drain implant is provided as an impurity implantation with a dose of an order of $10^{13}$-$10^{14}$ atoms per $cm^2$. The highly doped drain or source implant can be provided with an impurity concentration with an order of $10^{15}$ atoms per $cm^2$.

According to another embodiment of the invention, the access gate and/or the memory gate stack and the memory gate have two opposite sides each extending substantially vertically with respect to the semiconductor substrate, wherein a spacer is associated with each opposite side of the access gate and/or the memory gate stack and the memory gate, respectively. The spacer can be provided for example as a nitride spacer. The width of the access gate and both spacers associated to each one side of the access gate equals the width of the first implant, the access channel region and the second implant. The width of the memory gate and both spacers associated to each one side of the memory gate and the memory gate stack can equal the width of the third implant, the memory channel region and the fourth implant.

The object of the invention is further addressed by a method for manufacturing a multi-transistor, e.g. two-transistor memory cell arranged on a semiconductor substrate, comprising the steps of opening an area of the semiconductor substrate in which an access transistor and a memory transistor are to be formed while leaving a silicon active area free, depositing a memory gate stack in the area in which the access transistor and the memory transistor are to be formed, applying a mask above the memory gate stack in the area in which the memory transistor is to be formed, removing part of the memory gate stack in the area in which the access transistor is to be formed and stripping the mask above the memory gate stack in the area in which the memory transistor is to be formed, growing a first silicon layer above the memory gate stack and growing a second silicon layer above the area in which the memory transistor is to be formed, applying a first mask above the first silicon layer and applying a second mask above the second silicon layer, removing a part of the first silicon layer outside of the first mask and removing a part of the second silicon layer outside of the second mask for forming an access gate, and stripping the first mask and the second mask, applying four implants into the silicon active area, wherein each one implant is positioned close to each one end of the memory gate stack and the access gate, respectively, and applying four diffusion implants in the silicon active area, wherein the each two implants positioned close to the memory gate stack and to the access gate, respectively, are arranged intermediate each of two diffusion implants.

Such a multi-transistor, e.g. two-transistor memory cell according to the invention is advantageous over the prior art as it provides an increase reliability, while not putting any constraints on the memory cell size compared to manufacturing methods with an NMOS transistor as the access transistor known from the prior art. It should be noted that the method for manufacturing a multi-transistor, e.g. two-transistor memory cell according to the invention utilizes techniques known for semiconductor manufacturing from the prior art, such as for example dry etching, hydrofluoric acid (HF)-clean or wet etching.

According to another embodiment of the invention the memory gate stack comprises a bottom dielectric layer, a charge trapping layer, e.g. a nitride charge trapping layer, a top dielectric layer, a metal layer and a poly silicon layer, wherein the charge trapping layer, e.g. the nitride charge trapping layer is arranged above the bottom dielectric layer, the top dielectric layer is arranged above the charge trapping layer, e.g. the nitride charge trapping layer, the metal layer is arranged above the top dielectric layer, and the poly silicon layer is arranged above the metal layer. The charge trapping layer can comprise $Si_3N_4$. The poly silicon layer can be 10-20 nm thick.

According to another embodiment of the invention, the access transistor is provided as an enhancement junction field effect transistor (JFET). The JFET can be provided as a self-aligned JFET. Accordingly, and advantageous over the prior art, the invention allows for a method for manufacturing a multi-transistor, e.g. two-transistor memory cell comprising a JFET as the access transistor without adding any additional masks and/or processing steps.

According to another embodiment of the invention, the method for manufacturing a multi-transistor, e.g. two-transistor memory cell further comprises the step of creating a shallow n-type conductivity implantation in the silicon active area. Such a shallow n-type conductivity implantation is, in other words, carried out to create a depletion memory gate of the memory transistor, and preferably carried out during an initial flash-well implantation with a dedicated mask.

According to another embodiment of the invention, the first silicon layer and/or the second silicon layer are/is a $p^+$-type conductivity epitaxial silicon layer or a $p^+$-type conductivity poly silicon layer. The semiconductor substrate can comprise a flash p-well type conductivity silicon layer and a n-well type conductivity silicon layer, wherein the flash p-well type conductivity silicon layer is arranged above the n-well type conductivity silicon layer. According to another embodiment of the invention, the four implants are each a lowly or a moderately doped drain implant and/or the four diffusion implants are each a highly doped drain or source implant.

Memory cells as described above are preferably used in an array. Accordingly the present invention provides a memory array comprising at least one multi-transistor memory cell arranged on a semiconductor substrate comprising:

an access transistor and a memory transistor, the access transistor comprising an access channel region, a first implant and a second implant, a first diffusion implant and a second diffusion implant, and an access gate, wherein the access channel region is arranged intermediate the first implant and the second implant, the first implant and the second implant is arranged intermediate the first diffusion implant and the second diffusion implant, the access gate is arranged above the access channel region, the memory transistor comprises a memory channel region, a third implant and a fourth implant, a third diffusion implant and a fourth diffusion implant, a memory gate stack, and a memory gate, the memory channel region is arranged intermediate the third implant and the fourth implant, the third implant and the fourth implant is arranged intermediate the third diffusion implant and the fourth diffusion implant, the memory gate stack is arranged above the memory channel region, and the memory gate is arranged above the memory gate stack.

The array of memory cells may be provided with row/column addressing devices which allow each memory cell to be read and written independently, i.e. each memory cell in the array is individually addressable.

Such a memory array can be a NAND, NOR, 2T, AND or virtual ground type or is a FLASH or E²PROM memory.

These and other aspects of the invention will be apparent from and elucidated with reference to the embodiments described hereinafter.

DETAILED DESCRIPTION OF THE DRAWINGS

Figure 1:
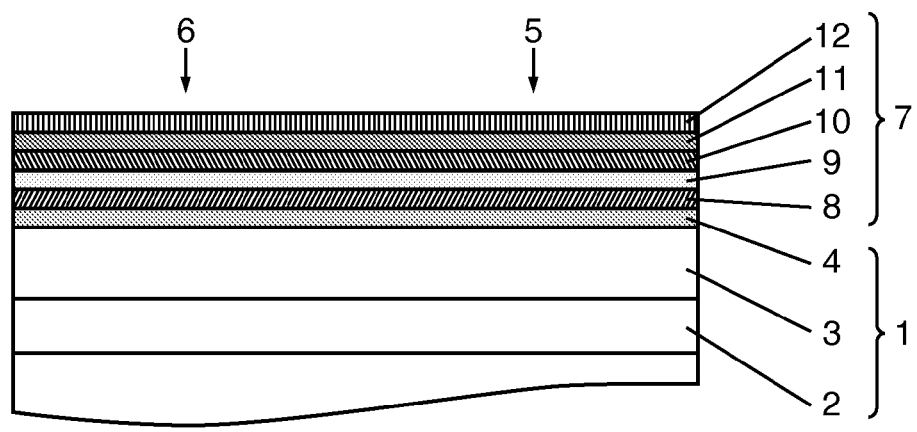
FIGS. 1-7 show different and subsequent manufacturing steps for manufacturing a two-transistor memory cell according to a embodiment of the invention

In the following detailed description, reference is made to the accompanying drawings, which form a part hereof, and within which are shown by way of illustration specific embodiments by which the invention may be practiced. The drawings described are only schematic and are non-limiting. In the drawings, the size of some of the elements may be exaggerated and not drawn on scale for illustrative purposes. Those skilled in the art will recognize that other embodiments may be utilized and structural changes may be made without departing from the scope of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

In embodiments of the present invention, the term "substrate" 1 may include any underlying material or materials that may be used, or upon which a device, a circuit or an epitaxial layer may be formed. In other alternative embodiments, this "substrate" 1 may include a semiconductor substrate 1 such as e.g. doped silicon, a gallium arsenide (GaAs), a gallium arsenide phosphate (GaAsP), a germanium (Ge) or a silicon germanium (SiGe) substrate 1. The "substrate" 1 may include, for example, an insulating layer such as a $SiO_2$ or a $Si_3N_4$ layer in addition to a semiconductor substrate 1 portion. Thus, the term "substrate" 1 also includes silicon-on-glass, silicon-on sapphire substrates 1. The term "substrate" 1 is thus used to define generally the elements for layers that underlie a layer or portions of interest. Also, the "substrate" 1 may be any other base on which a layer is formed, for example a glass or metal layer. The following processing steps are mainly described with reference to silicon processing but the skilled person will appreciate that the present invention may be implemented based on other semiconductor material systems and that the skilled person can select suitable materials as equivalence of the dielectric and conductive materials described below.

In the following a multi-transistor memory cell according to the present invention will be exemplified in detail as a two-transistor memory cell.

In a first manufacturing step for manufacturing a two-transistor memory cell according to an embodiment of the invention, and as depicted in FIG. 1, a substrate 1 is provided. The substrate 1 comprises a n-well type conductivity silicon layer 2, a flash p-well type conductivity silicon layer 3 arranged above the n-well type conductivity silicon layer 2 and a silicon active area % provided as a shallow n-type conductivity implant or a depletion (phosphorus) layer, arranged above the flash p-well type conductivity silicon layer 3. During the respective manufacturing step, a flash/EEPROM area is opened using the same mask for the flash well definition after a first poly silicon layer, in an area where an access transistor 5 and a memory transistor 6 are to be formed. In other words, the opening of the flash/EEPROM area entails the removal of the poly silicon layer for the access transistor 5 and the memory transistor 6, as well as the respective oxides, leaving the silicon active area 4 free for further processing.

As can be seen further from FIG. 1, a memory gate stack 7 is deposited on the semiconductor substrate 1. The memory gate stack 7 comprises, from the bottom to the top, a bottom dielectric layer 8, a charge trapping layer, e.g. a nitride charge trapping layer 9, a top dielectric layer 10, a metal layer 11 and a poly silicon layer 12. According to the embodiment of the invention, the bottom dielectric layer 8 is provided as a tunnelling high-K dielectric layer, the charge trapping layer, e.g. the nitride charge trapping layer 9 is provided as a $Si_3N_4$ charge trapping layer, the top dielectric layer 10 is provided as a blocking dielectric layer, and the poly silicon layer 12 is provided with a thickness between 10 and 20 nm. It should be noted that the poly silicon layer 12 is meant to protect the memory gate stack 7 and support the growth of the memory gate 21 within a later manufacturing step.

Figure 2:
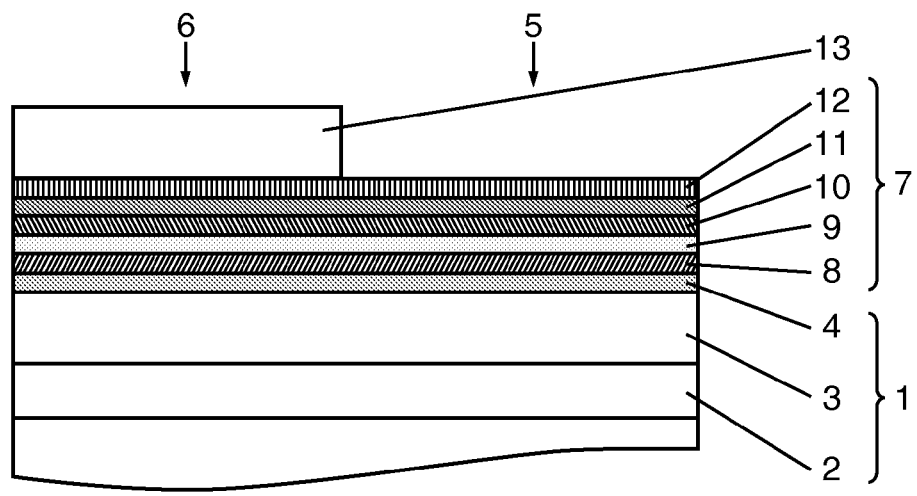
Figure 3:
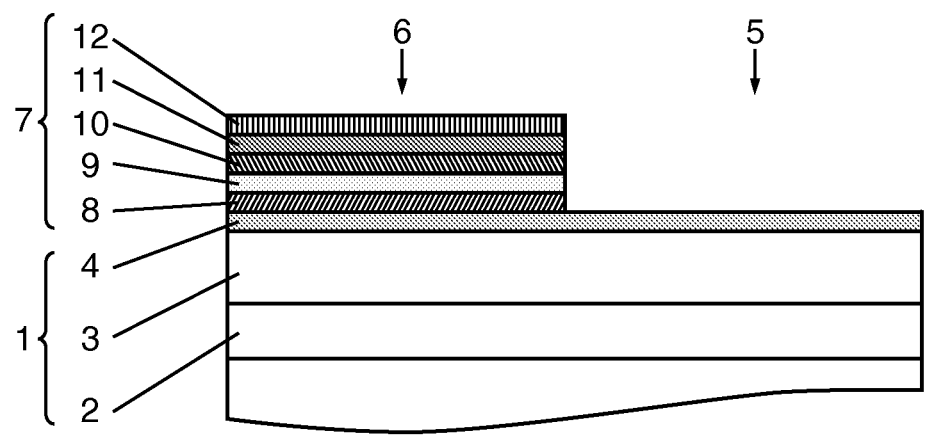

As can be seen from FIG. 2, a mask 13 is applied above the memory gate stack 7 in the area in which the memory transistor 6 is to be formed. Within the next manufacturing step, the memory gate stack 7 is a dry etched stopping on the silicon active area 4, as shown in FIG. 3. As it can be seen further, the memory gate stack 7 is partly removed in the area in which the access transistor 5 is to be formed.

During the initial flash well implantation with a dedicated mask, shallow n-type implantations are carried out for creating the depletion memory channel region 23 of the memory transistor 6. The same implants are utilized for creating an access channel region 14, depicted in FIG. 6, of an enhancement junction field effect transistor (JFET) as access transistor 5. These implants can be adjusted after the previous dry etch manufacturing step using the mask 13.

Figure 4:
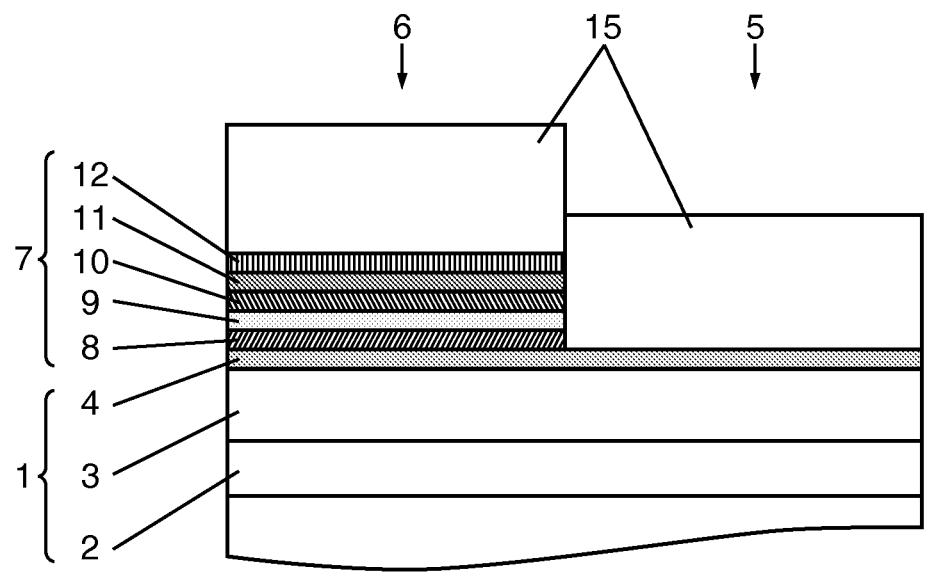
Figure 5:
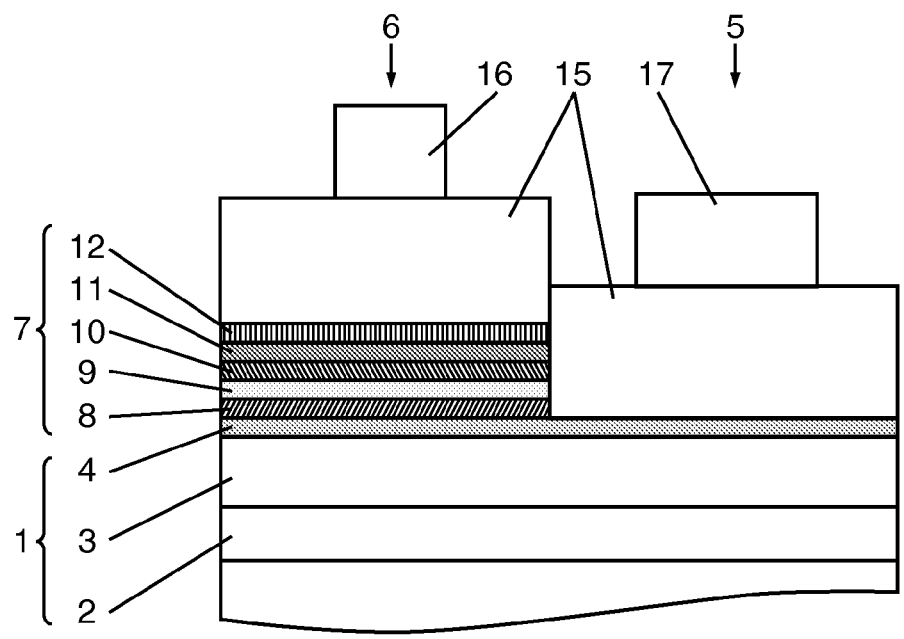
Figure 6:
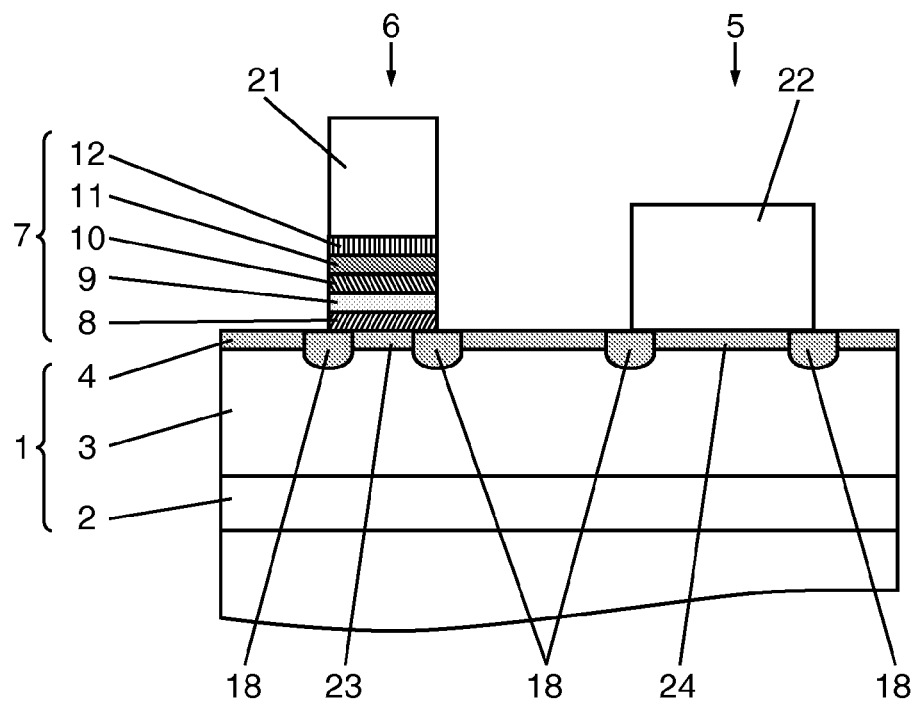

Upon and hydrofluoric acid (HF)-clean of the silicon surface, and as depicted in FIG. 4, a $p^+$-doped epitaxial silicon layer 15 is grown. Within a next manufacturing step, as it can be seen in FIG. 5, a first mask 16 is applied above the p-doped epitaxial silicon layer 15 provided in the area where the memory transistor 6 is to be formed and a second mask 17 is provided above the $p^+$-doped epitaxial silicon layer 15 provided in the area where the access transistor 5 is to be formed. The access transistor 5 and the memory transistor 6 are formed by dry etching, possibly within additional wet etch step, to clean any remaining high-K dielectrics, followed by a resist strip, as depicted in FIG. 6. In this way, a memory gate 21 and an access gate 22 are formed.

Figure 7:
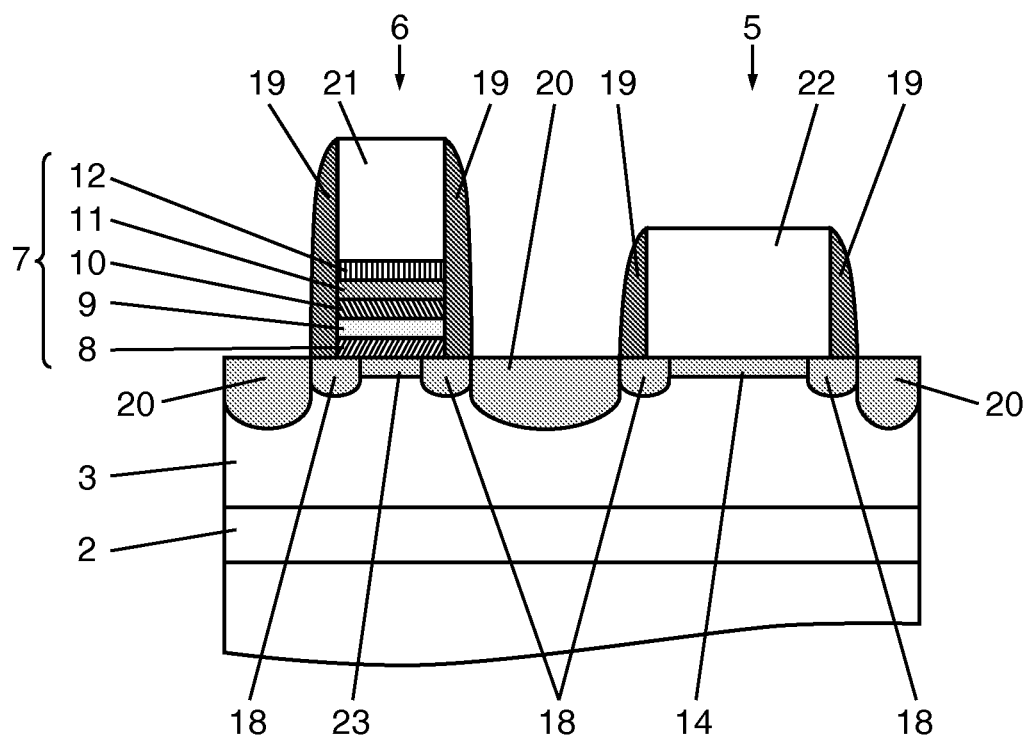

Hereafter, and as depicted in FIG. 6 and FIG. 7, the manufacturing is equivalent to standard MOS integration and comprises lowly or moderately doped drain implants 18, the formation of d-shaped spacers such as nitride spacers 19 and highly doped drain and source implants 20, followed by the standard mid and back end of line processing.

The role of the access gate of the access transistor 5 provided as a JFET is played by the $p^+$-doped epitaxial silicon layer 15 grown upon the mask 13 is applied. In this way, it is feasible to realize a JFET transistor in a self-aligned fashion and keep the memory cell size comparable to the standard MOS based memory cells. It is to be noted that the n-type channel implants providing the memory channel region 14 of the access transistor 5 provided as JFET are such, that this layer is fully depleted without any biased applied to the memory cell. In addition, the lowly or moderately doped drain implants 18 and/or highly doped drain and source implants 20 of the access transistor 5 provided as JFET can be optimized with respect to desired read current and a breakdown of drain to gate and source to gate junctions, respectively.

The multi-transistor memory cell according to any embodiment of the present invention may be implemented in memory array configurations. The array of memory cells may be provided with row/column addressing devices which allow each memory cell to be read and written independently, i.e. each memory cell in the array is individually addressable. The memory cells according to embodiments of the present invention may be used in devices such as NAND, NOR, AND, 2T and virtual ground type memory arrays as well as in FLASH and E²PROM memories.

The multi-transistor memory cell according to embodiments of the present invention may find useful application in a variety of semiconductor electronic devices. In particular, a memory array according to embodiments of the present invention may find useful application in a variety of electronic devices such as PDA's, mobile telephones, memory sticks, smart phones, etc.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. Multi-transistor memory cell arranged on a semiconductor substrate comprising:
   an access transistor and a memory transistor,
   the access transistor comprising an enhancement junction field effect transistor having an access channel region, a first implant and a second implant, a first diffusion implant and a second diffusion implant, and an access gate, wherein
   the access channel region is arranged intermediate the first implant and the second implant,
   the first implant and the second implant is arranged intermediate the first diffusion implant and the second diffusion implant,
   the access gate is arranged above the access channel region,
   the memory transistor comprises a memory channel region, a third implant and a fourth implant, a third diffusion implant and a fourth diffusion implant, a memory gate stack, and a memory gate,
   the memory channel region is arranged intermediate the third implant and the fourth implant,
   the third implant and the fourth implant is arranged intermediate the third diffusion implant and the fourth diffusion implant,
   the memory gate stack is arranged above the memory channel region, and
   the memory gate is arranged above the memory gate stack.

2. Multi-transistor memory cell according to claim 1, wherein the memory gate stack comprises a bottom dielectric layer, a charge trapping layer, a top dielectric layer, a metal layer and a poly silicon layer, and wherein the charge trapping layer is arranged above the bottom dielectric layer, the top dielectric layer is arranged above the charge trapping layer, the metal layer is arranged above the top dielectric layer, and the poly silicon layer is arranged above the metal layer.

3. Multi-transistor memory cell according to claim 1, wherein the access channel region and/or the memory channel region are/is a shallow n-type conductivity implant.

4. Multi-transistor memory cell according to claim 1, wherein the access gate and/or the memory gate are/is a $p^+$-type conductivity epitaxial silicon layer or a $p^+$-type conductivity poly silicon layer.

5. Multi-transistor memory cell according to claim 1, wherein the semiconductor substrate 1 comprises a flash p-well type conductivity silicon layer 3 and a n-well type conductivity silicon layer 2, wherein the flash p-well type conductivity silicon layer 3 is arranged above the n-well type conductivity silicon layer 2.

6. Multi-transistor memory cell according to claim 1, wherein the first implant and/or the second implant and/or the third implant and/or the fourth implant are/is a lowly or a moderately doped drain implant and/or the first diffusion implant and/or the second diffusion implant and/or the third diffusion implant and/or the fourth diffusion implant are/is a highly doped drain or source implant.

7. Multi-transistor memory cell according to claim 1, wherein the access gate and/or the memory gate stack and the memory gate have two opposite sides each extending substantially vertically with respect to the semiconductor substrate 1, and wherein a spacer is associated with each opposite side of the access gate and/or the memory gate stack and the memory gate, respectively.

8. A memory array comprising the Multi-transistor memory cell of claim 1.

9. Memory array according to claim 8, wherein the memory array is one of a NAND, NOR, 2T, and a virtual ground type or is a FLASH or $E^2$PROM memory, or combination thereof.

10. A semiconductor device comprising at least one memory cell according to claim 1.

\* \* \* \* \*